United States Patent [19]

Miyake

[11] Patent Number: 5,408,197
[45] Date of Patent: Apr. 18, 1995

[54] AUTOMATIC POWER CONTROL CIRCUIT FOR CONTROLLING TRANSMITTING POWER OF MODULATED RADIO FREQUENCY SIGNAL

[75] Inventor: Atsushi Miyake, Hyogo, Japan

[73] Assignee: Mitsubishi Denki Kabushiki Kaisha, Tokyo, Japan

[21] Appl. No.: 202,750

[22] Filed: Feb. 28, 1994

[30] Foreign Application Priority Data

Mar. 4, 1993 [JP] Japan .................... 5-043794

[51] Int. Cl.⁶ .............................. H03G 3/20
[52] U.S. Cl. ............................ 330/129; 330/282
[58] Field of Search ............. 330/86, 129, 141, 281, 330/282; 455/126

[56] References Cited

U.S. PATENT DOCUMENTS

| | | | |
|---|---|---|---|
| 5,144,258 | 9/1992 | Nakanishi et al. | 330/129 |
| 5,179,353 | 1/1993 | Miyake | 330/129 |
| 5,204,637 | 4/1993 | Trinh | 330/129 |
| 5,208,550 | 5/1993 | Iwane | 330/129 |

FOREIGN PATENT DOCUMENTS 62-142442  6/1987  Japan .

*Primary Examiner*—Steven Mottola
*Attorney, Agent, or Firm*—Rothwell, Figg, Ernst & Kurz

[57] ABSTRACT

An automatic power control circuit controls the output power of a transmitting RF signal having envelope fluctuations generated by the modulation. The circuit uses a feedback signal which is a difference signal between an envelope provided by detecting the RF output signal, and a reference voltage corresponding to the transmitting power. At this time, fluctuation components included in the envelope and generated by the modulation is removed by the use of a low-pass filter. This circuit secures the sharpness in the leading edge of the burst signal by reducing the time constant of the low-pass filter in the rise time of the burst signal and increasing the time constant of the low-pass filter in the data periods.

21 Claims, 6 Drawing Sheets

AUTOMATIC POWER CONTROL CIRCUIT FOR CONTROLLING TRANSMITTING POWER OF MODULATED RADIO FREQUENCY SIGNAL

BACKGROUND OF THE INVENTION

1. Field of the Invention

The present invention relates to an automatic power control (APC) circuit for controlling the transmitting power of a modulated radio frequency (RF) signal and particularly to such a circuit suitable for use in a time division multiple access (TDMA) system in which the RF signal is required to be linearly amplified.

2. Description of the Related Art

In the accompanying drawings, FIG. 1 shows a conventional power amplifying device having an APC function. After a modulated RF signal 1 has been regulated in level by a variable gain amplifier 2, it is linearly amplified to a predetermined transmitting power by a power amplifier 3, the amplified signal being then sent out as an RF output signal 4. The modulated RF signal 1 is one that has envelope fluctuations such as a $\pi/4$ shift QPSK signal. $\pi/4$ shift QPSK has one set of 4 signal points $(0, \pi/2, \pi, 3\pi/2)$ and one other set of signal points $(\pi/4, 3\pi/4, 5\pi/4, 7\pi/4)$ which are shifted by $\pi/4$ from the first set of signal points, and these two sets of signal points are used alternately for every two bits. Therefore, every time the signal point changes, the carrier wave changes discontinuously and the amplitude modulation component is generated. This amplitude modulation component causes fluctuation of the envelope of the RF signal.

Even if the level of the inputted RF signal 1 happens to fluctuate or even if there are fluctuations in supply voltage, the level of the RF output signal 4 must be within a predetermined range. In such a relatively small-sized wireless transmitter-receiver as is normal for an in-vehicle type or portable type, however, the supply voltage tends to fluctuate, resulting in fluctuations of the RF output signal level. It is therefore required to monitor the level of the RF output signal 4 at all times such that the variable gain amplifier 2 can be subjected to feedback to suppress the fluctuations in the RF output signal 4. To this end, a detector 5 detects the RF output signal 4 to provide a detection signal 6. This detection signal 6 represents the envelope of the RF output signal 4.

The detection signal 6, that is the envelope of the RF output signal 4, is provided to a fluctuation removing circuit 8 wherein the detection signal 6 is compared with an envelope 7 which is obtained from a base band signal. The envelope 7 has already been calculated by an envelope calculating unit 13 as a square root of $(I^2+Q^2)$, where I is in-phase component of the base band signal and Q is orthogonal component of the base band signal.

The fluctuation removing circuit 8 outputs a difference between the detection signal 6 and the envelope 7 calculated from the base band signal. Such a difference between two envelopes does not contain fluctuation components which are produced by the modulation.

The output of the fluctuation removing circuit 8 is inputted into a comparator 9 which in turn outputs a difference signal between the output signal of the fluctuation removing circuit 8 and a reference voltage 10 outputted from a reference voltage generator 14 and corresponding to the transmitting power. The difference signal is passed through a low-pass filter 11 and outputted as a feedback control signal 12 after any influence of noise or the like has been removed. The feedback control signal 12 is fed back to the gain regulating terminal 2a of the variable gain amplifier 2 which is located forward of the power amplifier 3.

In such a manner, the transmitting power of the RF output signal 4 in the same power level can be controlled by the variable gain amplifier 2 which is disposed on the input side of the power amplifier 3. More particularly, the feedback control signal 12 functions to reduce the gain of the variable gain amplifier 2 if the transmitting power of the RF signal increases. When the transmitting power of the RF signal decreases, the feedback control signal 12 functions to increase the gain of the variable gain amplifier 2. Thus, the RF output signal 4 can have a constant average power.

In such an arrangement, the APC circuit of the prior art must determine an envelope from the computation of a base band signal to compare it with the detection signal of the RF output signal. The APC circuit of the related art raises a problem in that it requires complicated and large-scaled hardware for calculating the envelope from the base band signal.

SUMMARY OF THE INVENTION

In order to overcome the aforementioned problem an object of the present invention is to provide an APC circuit which can remove fluctuation components contained in the envelope of the RF output signal without the need for the envelope of the base band signal.

To this end, the present invention provides an automatic power control circuit comprising a variable gain amplifier responsive to a signal applied to a gain regulating terminal for regulating the gain of an RF input signal, a detector for detecting an envelope from an RF output signal corresponding to the output signal of the variable gain amplifier, a fluctuation removing circuit including a low-pass filter for removing fluctuation components generated by the modulation in said envelope, and a comparator for providing a difference between the output signal of the fluctuation removing circuit and a reference voltage obtained from a reference voltage generator to the gain regulating terminal as a feedback signal, whereby the fluctuation components generated by the modulation in the envelope of the RF output signal can be removed by the low-pass filter.

If the fluctuation removing circuit is of a structure switchable such that the time constant of the low-pass filter is smaller in the rise time of the RF signal, but larger during the data period of the RF signal, the rise time can reliably be shortened during the ramp time of a burst-like transmitting signal. During the data period, the fluctuation components in the envelope can be removed.

The present invention also provides an automatic power control circuit comprising a variable gain amplifier responsive to a signal applied to a gain regulating terminal for regulating the gain of an RF input signal, a detector for detecting an envelope from an RF output signal corresponding to the output signal of the variable gain amplifier, a coupler for fetching an AC component from said envelope, a subtraction circuit for subtracting the output of the coupler from the envelope which is the output of said detector, and a comparator for providing a difference between the output signal of said subtraction circuit and a reference voltage obtained from a reference voltage generator to the gain regulating terminal as a feedback signal, whereby fluctuation components of said RF output signal envelope generated by the modulation can be extracted by the coupler as the AC component which is in turn subtracted from the envelope of the RF output signal by the subtraction circuit to remove the fluctuation components.

BRIEF DESCRIPTION THE DRAWINGS

DETAILED DESCRIPTION OF THE PREFERRED EMBODIMENTS

Figure 1:
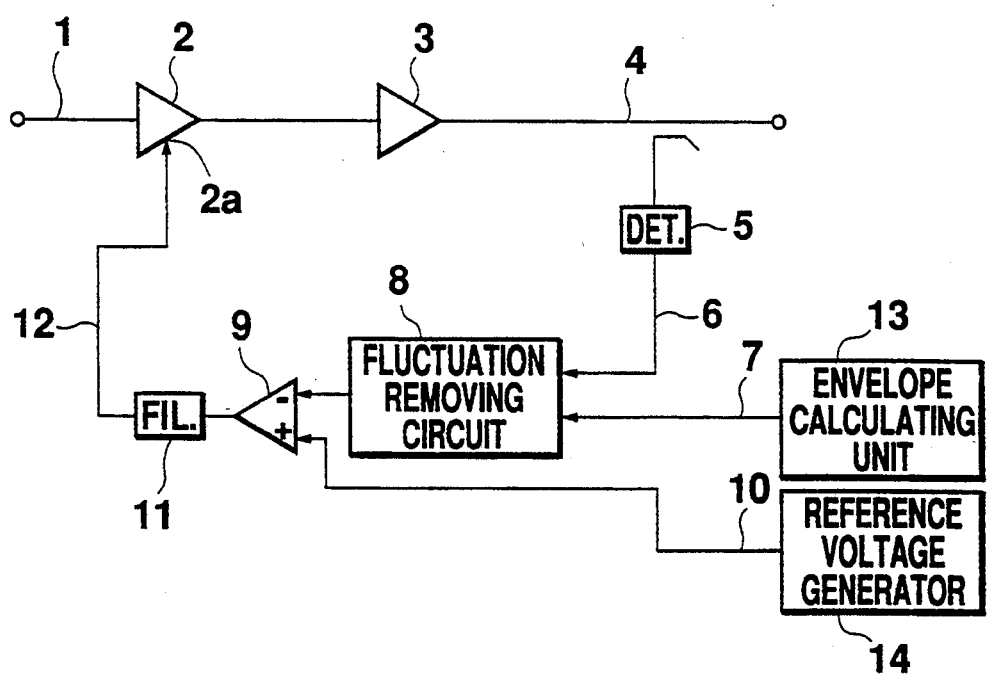
FIG. 1 is a block diagram of a conventional power amplifying device having APC function.

The preferred embodiments of the present invention will be described with reference to the drawings in which parts coincident with or corresponding to parts described in connection with the related art are designated by similar reference numerals and will not be further described.

Figure 2:
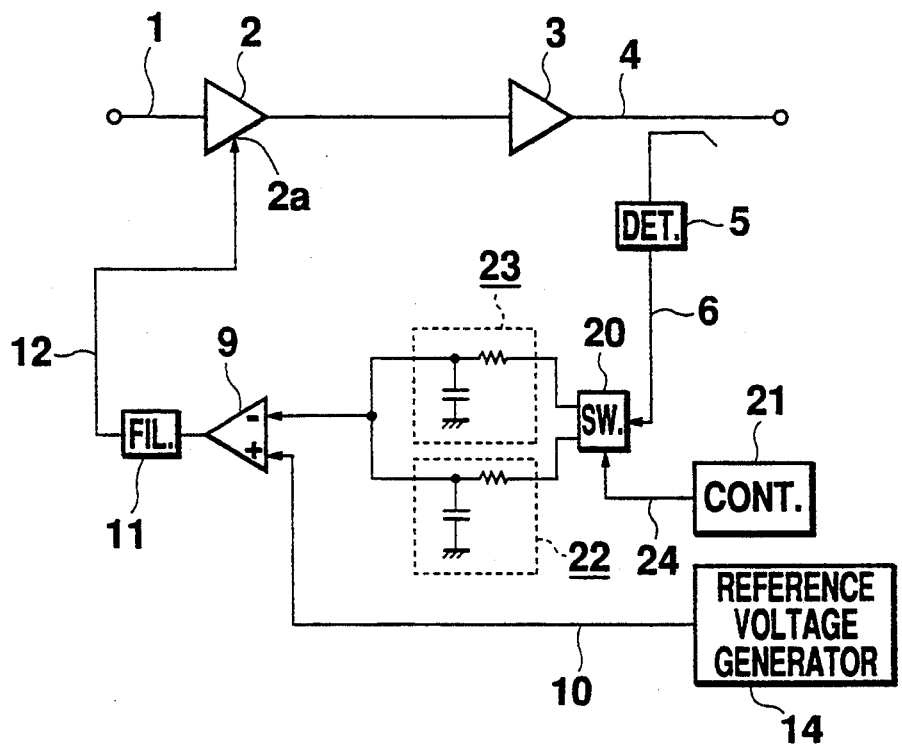
FIG. 2 is a block diagram of a first embodiment of an APC circuit constructed in accordance with the present invention.

FIG. 2 shows the first embodiment of the present invention in which a signal 1 is a modulated RF signal to be amplified by the circuit of the first embodiment. The RF signal 1 may mainly include a signal having envelope fluctuations such as $\pi/4$ shift QPSK signal, that is, a signal required to be linearly amplified. A variable gain amplifier 2 may be in the form of an automatic gain control (AGC) amplifier which can vary its own gain depending on a control signal applied to a gain regulating terminal 2a. A power amplifier 3 can linearly operate to amplify the RF signal 1 to a given level. A signal 4 is the output signal of the power amplifier 3. A detector 5 detects the RF output signal 4 to output an envelope 6. A switching device 20 is responsive to a switching control signal 24 from a control unit 21 to select a low-pass filter into which the envelope 6 is to be inputted. The control unit 21 may comprise a CPU or digital signal processor (DSP). A low-pass filter 22 is one having a smaller time constant to secure a short rise time of a transmitting burst while a low-pass filter 23 is one having a larger time constant sufficient to remove fluctuation components in the envelope 6 which may be generated by the modulation. A comparator 9 compares the output signal of one of the low-pass filters 22 and 23 with a reference voltage 10 outputted from a reference voltage generator 14 to form a feedback control signal. Since it is required to increase or decrease the transmitting power level in the RF signal depending on a condition such as a distance between the circuit of the present invention and a base station or the like, the reference voltage 10 has been regulated into a value corresponding to the transmitting power level of the RF signal. Such a regulation of power level is generally controlled by the base station through a control channel. A low-pass filter 11 removes noise in the output signal of the comparator 9. A signal 12 is a feedback control signal in which noise has been removed.

Figure 3:
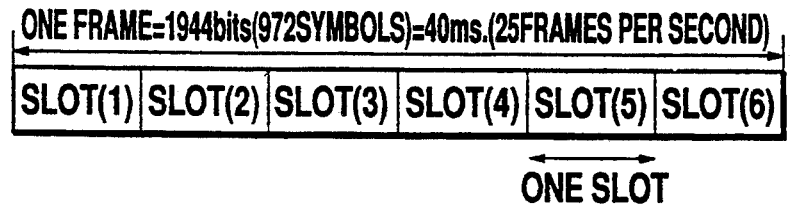
FIG. 3 is a view illustrating a frame structure in a TDMA system.
Figure 4:
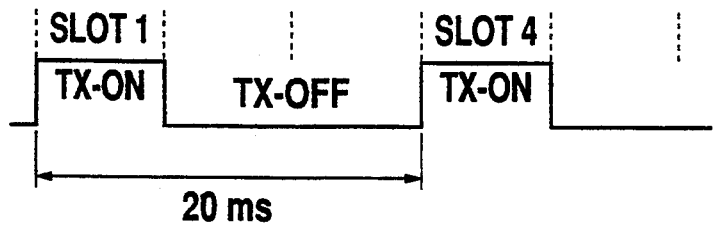
FIG. 4 is a view illustrating transmitting slots in the TDMA system.
Figure 5:
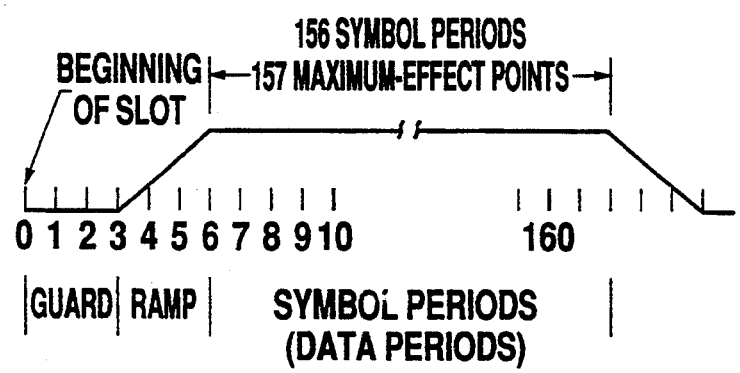
FIG. 5 is a view illustrating the details of a transmitting slot in the TDMA system.

In order that the circuit of the present embodiment can be better understood in operation, a frame structure in the TDMA system will be described below. FIG. 3 shows a frame structure of the North American digital cellular system which is stated in IS-54 of EIA/TIA. One frame is 40 ms and includes six slots. In North America, a three-channel TDMA system is used. As shown in FIG. 4, therefore, a slot (1) after it has been used for transmission in a transmitter is followed by a transmitting slot (4) in the same transmitter. FIG. 5 shows the details of a transmitting slot or burst. IS-54 states that the rise time of the transmitting burst should be within the three-symbol ramp period following the guard period. This requires the shortening of the rise time. This standard takes a $\pi/4$ shift QPSK signal as a digital signal. The present embodiment will now be described as to the processing of an RF signal according to such a standard. It is however to be understood that the APC circuit of the present invention can be effective in a modified standard and also in the absence of any standard.

The operation of the first embodiment will now be described.

After the modulated RF signal 1 has been regulated in level by a variable gain amplifier 2, it is linearly amplified to a predetermined transmitting power by a power amplifier 3, the amplified signal being then sent out as an RF output signal 4.

Even if the level of the inputted RF signal 1 happens to fluctuate or even if there are fluctuations in supply voltage, the level of the RF output signal 4 must be within a predetermined range. Therefore, the feedback is required to control the level of the RF output signal 4, as in the related art.

The detection signal 6 of the RF output signal detected by the detector 5 represents the envelope of the RF output signal 4. In the $\pi/4$ shift QPSK modulation system, the detection signal 6 will contain fluctuation components generated by the modulation. In the present embodiment, it is the low-pass filter 23 that removes the fluctuation components generated by the modulation.

If a low-pass filter having a time constant sufficient to remove the fluctuation components generated by the modulation is provided in the APC loop, it is difficult to satisfy requirements for the rise time of the transmitting burst. In addition to the low-pass filter 23 having a larger time constant, thus, the low-pass filter 22 having a smaller time constant is also used. More particularly, the low-pass filter 22 does not necessarily require a time constant sufficient to completely remove the fluctuation components generated by the modulation if it can satisfy requirements for the rise time of the transmitting burst.

Figure 6:
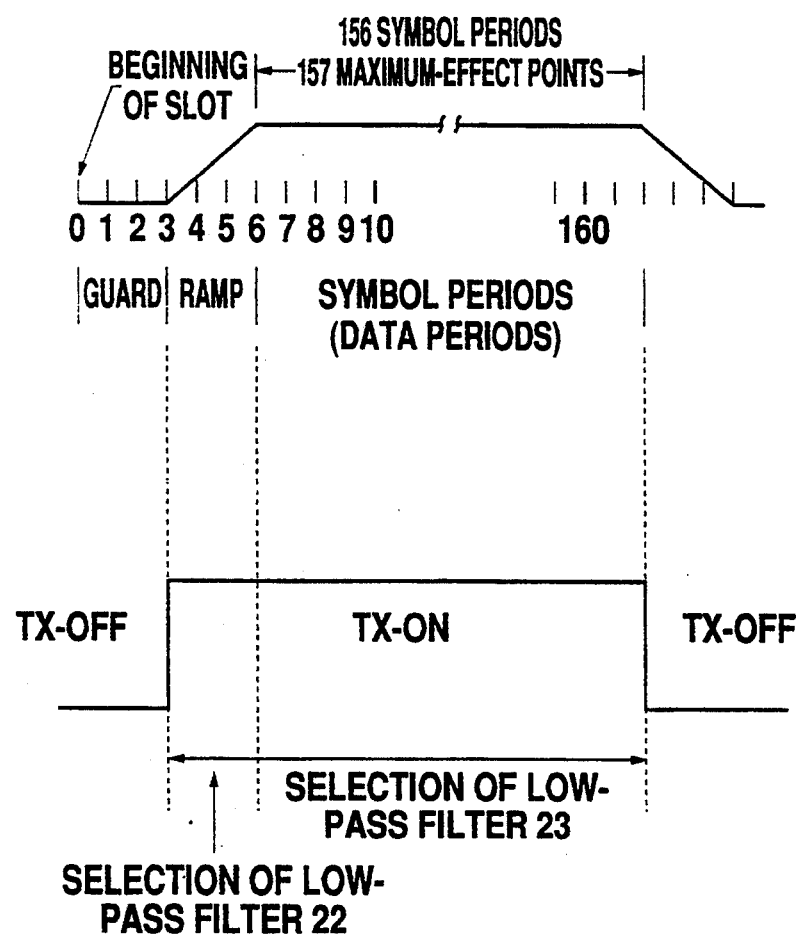
FIG. 6 is a timing chart illustrating the selection of low-pass filters in the transmitting slot.

The detection signal 6 is inputted into the switching unit 20 for selecting the low-pass filters. The detection signal 6 is supplied to one of the low-pass filters which is selected by a switching control signal 24 from the control unit 21. As shown in FIG. 6, the switching unit 20 is adapted to give the detection signal 6 to the low-pass filter 22 having a smaller time constant in the rise time of a transmitting slot, that is, during the three-symbol ramp period. During the data periods following the ramp period, the detection signal 6 will be inputted into the low-pass filter 23 having a larger time constant. Thus, the rise time of the burst signal can reliably be shortened while removing the fluctuations of the envelope which is generated by the modulation in the data period.

After the fluctuation components in the envelope of the detection signal have been removed by the low-pass filter, the detection signal is inputted into the comparator 9. The comparator 9 outputs a difference signal between the detection signal having no fluctuation component and the reference voltage 10. The difference signal is passed through the low-pass filter 11 wherein any influence due to noise or the like is eliminated to provide a feedback control signal 12. The feedback control signal 12 is fed back to the gain regulating terminal 2a of the variable gain amplifier 2. The low-pass filter 11 may be omitted if the feedback control signal outputted from the comparator 9 has sufficiently low noise.

In such a manner, the transmitting power of the RF output signal 4 in the same transmitting power level can be controlled by the variable gain amplifier 2. The APC circuit can reduce the gain of the variable gain amplifier 2 if the average transmitting power increases and increase the gain of the variable gain amplifier 2 if the average transmitting power decreases. Therefore, the RF output signal 4 can have a constant average power.

Since the fluctuations of the envelope generated by the modulation are removed by the low-pass filter, the present embodiment can provide an APC circuit reduced in scale without the need of a computing function and the like which calculate the envelope from the base band signal as in the related art.

Furthermore, the rise time of the transmitting burst can be shortened since two low-pass filters having different time constants are selectively used.

The time constants in the two low-pass filters can suitably be selected depending on various conditions such as the required rise condition of the transmitting burst, the required condition of fluctuation removal and others.

Figure 7:
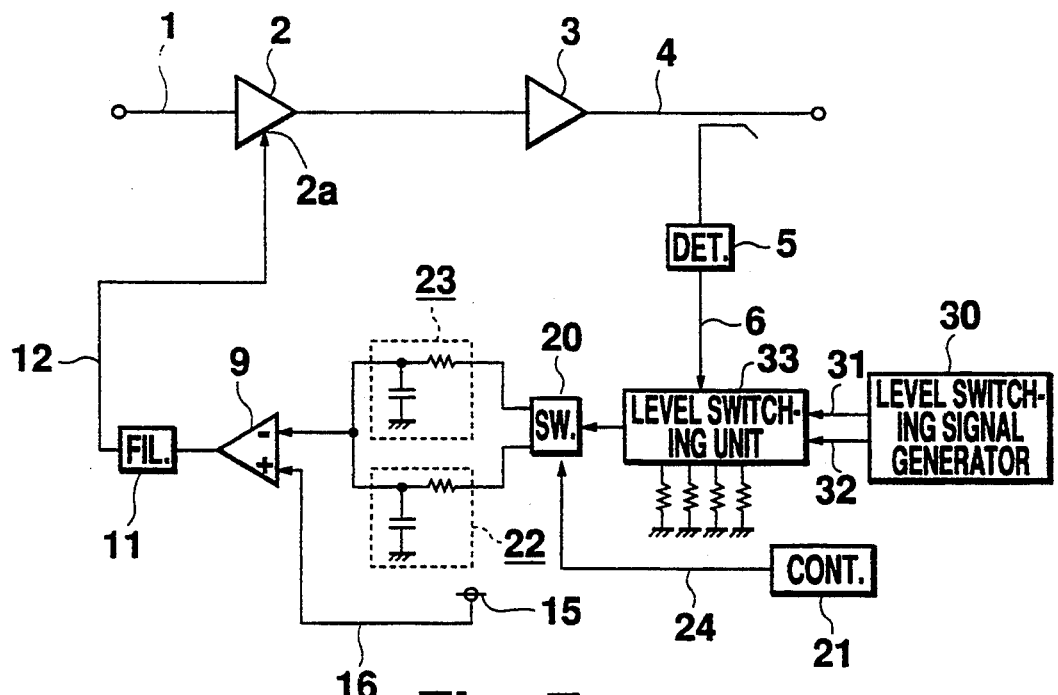
FIG. 7 is a block diagram of a second embodiment of an APC circuit constructed in accordance with the present invention.

FIG. 7 shows the second embodiment of the present invention. The second embodiment is different from the first embodiment in that the second embodiment is adapted to select the level of the detection signal, that is, the envelope of the RF output signal 4 obtained by the detector 5, and uses a constant bias 16 as a reference voltage in the comparator 9 for Generating the feedback control signal 12.

The first embodiment is adapted to set the reference voltage selectively at one of a plurality of levels to increase or decrease the transmitting power. If a constant bias is used as a reference voltage, such a function cannot be performed by the first embodiment. Therefore, the second embodiment comprises a level switching unit 33 disposed forward of the detection signal input of the low-pass filter.

In operation, the detection signal 6 of the RF output signal 4 obtained by the detector 5 is inputted into a level switching unit 33 which may be in the form of a multiplexer. After the detection signal 6 has been inputted into the level switching unit 33, the level of the detection signal 6 is selected depending on detection level switching signals 31 and 32 from a switching signal Generator 30. The level switching unit 33 is adapted to regulate a resistance on shunt of the detection signal 6 to change the level of the detection signal inputted into the low-pass filter switching unit 20. In FIG. 7, the level switching unit 33 includes four resistors which are controlled by two level switching signals 31 and 32.

After the level of the detection signal 6 has been selected by the level switching unit 33, the detection signal 6 is then inputted into the low-pass filter switching unit 20, thereafter the fluctuation components of the envelope generated by the modulation are removed in a manner similar to that of the first embodiment. After the fluctuation components have been removed, the detection signal is inputted into the comparator 9.

When the detection signal is inputted into the comparator 9, the detection signal has no fluctuation components in its envelope generated by the modulation and at the same time a DC component depending on the transmitting power to be outputted from the APC circuit. The comparator 9 provides a difference between the detection signal and a constant reference voltage 16 given by a source of constant voltage 15. Even if the reference voltage is a constant bias, thus, the APC circuit of the second embodiment can operate in a manner similar to that of the first embodiment.

The feedback control signal outputted from the comparator 9 is inputted into the gain regulating terminal 2a after noise has been removed. Thus, the transmitting power of the RF output signal 4 in the same power level can be maintained constant.

It is to be noted that the level switching unit 33 in the second embodiment is not limited to that shown in FIG. 7. The level switching unit 33 may be in the form of an electronic volume in which the level can be continuously changed.

The arrangement of the second embodiment in which a constant reference voltage is used and the level of the detection signal is changed depending on the level of the transmitting power is effective for the other embodiments described later, in addition to the first embodiment.

Figure 8:
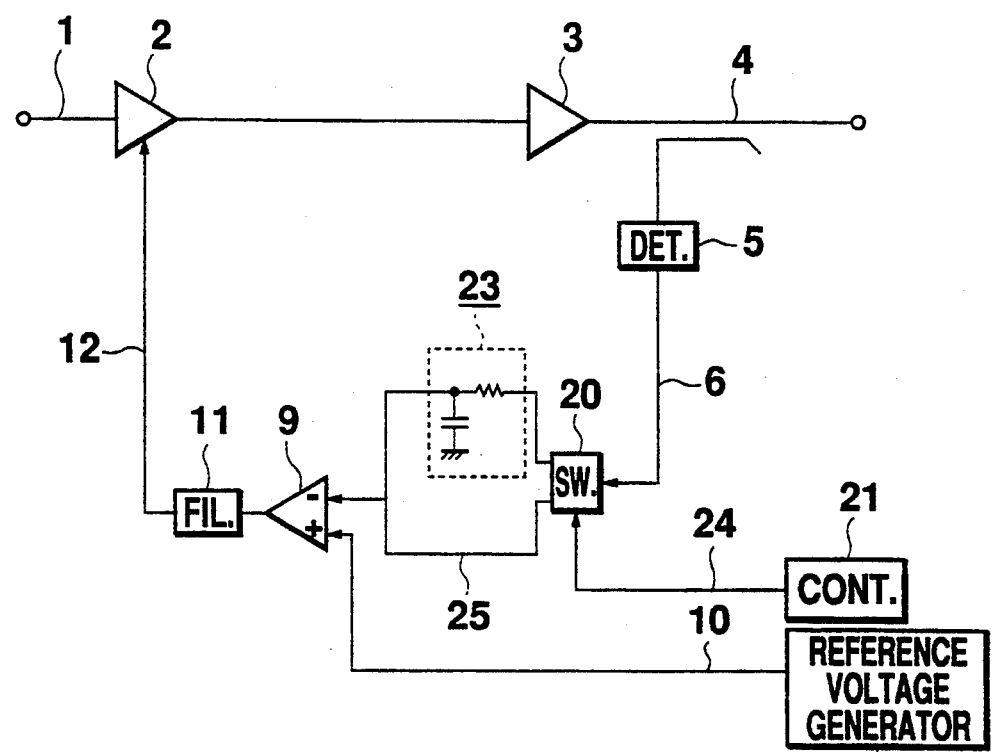
FIG. 8 is a block diagram of a third embodiment of an APC circuit constructed in accordance with the present invention.

FIG. 8 shows the third embodiment of the present invention. The third embodiment is characterized by that only the low-pass filter 23 having a larger time constant is used and the low-pass filter having a smaller time constant is replaced by a short-circuit line 25.

The low-pass filter 23 should have a time constant sufficient to remove the fluctuations of the envelope generated by the modulation.

In operation, the detection signal 6 detected by the detector 5 is inputted into the switching unit 20 wherein it is selected by the switching control signal 24 whether or not the detection signal 6 should be passed through the low-pass filter 23. In the third embodiment, a sharp leading edge of the transmitting slot can be secured by causing the detection signal 6 to pass through the short-circuit line 25. After termination of the ramp period, the detection signal is passed through the low-pass filter 23. Thus, the fluctuations of the envelope generated by the modulation of data section will be removed. Since the third embodiment does not have the low-pass filter 22, the circuit scale can be reduced to provide a more simplified circuit.

Figure 9:
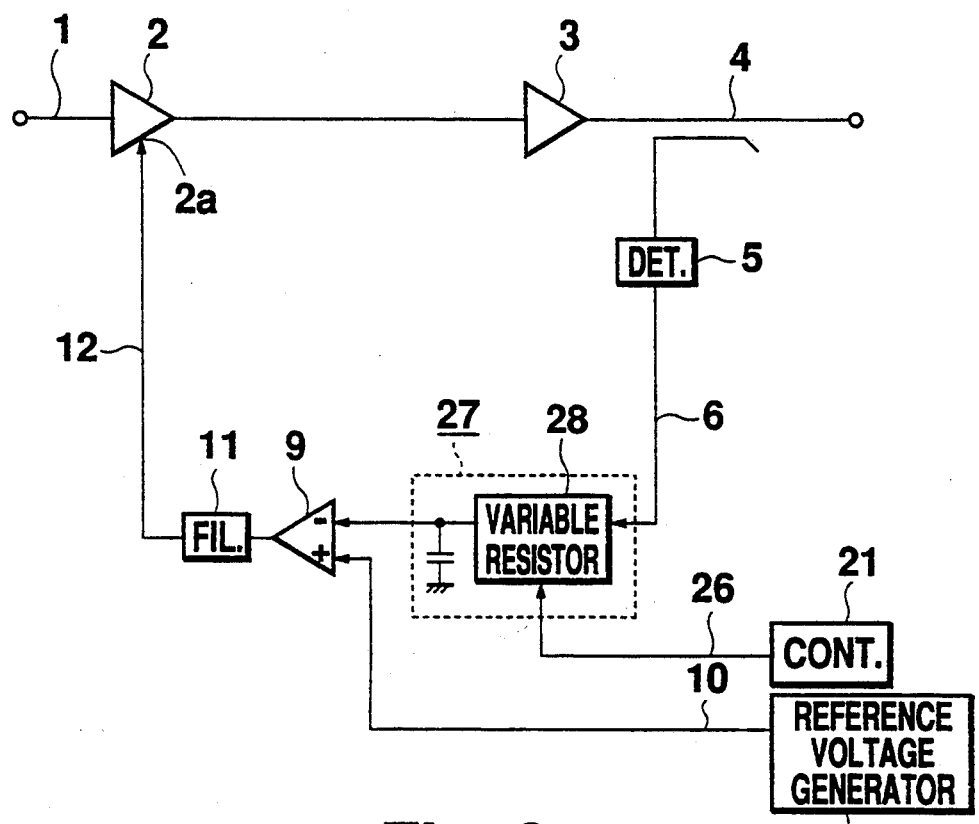
FIG. 9 is a block diagram of a fourth embodiment of an APC circuit constructed in accordance with the present invention.

FIG. 9 shows the fourth embodiment of the present invention. In FIG. 9, a time constant control signal 26 is provided by the control unit 21 and serves to control the time constant in a variable filter section 27 which functions as a low-pass filter. The variable filter section 27 includes a variable resistor 28, the resistance of which is controlled by the time constant control signal 26. The variable resistor 28 may be in the form of an electronic volume. The variable filter section 27 of the fourth embodiment is adapted to increase the time constant as the potential of the time constant control signal 26 decreases. The fourth embodiment is characterized by that the time constant in a single low-pass filter is controlled, rather than selection of low-pass filters having different time constants.

Figure 10:
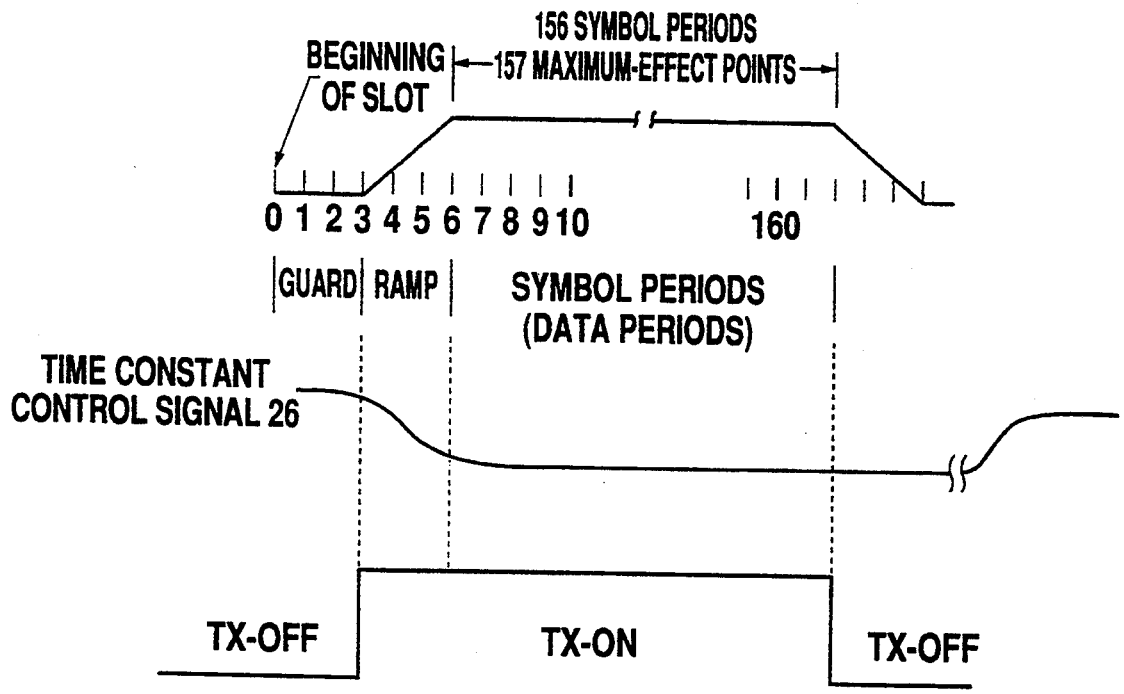
FIG. 10 is a timing chart illustrating the relationship between a transmitting slot and a time constant control signal in the fourth embodiment.

FIG. 10 illustrates a transmitting slot (transmitting burst) as well as the control of the variable filter section 27. More particularly, during the rise time of the transmitting slot, the potential of the time constant control signal 26 is reduced to increase the time constant of the variable filter section 27. In the data periods following the rise time, the potential of the time constant control signal 26 will be increased to a sufficient level that the time constant of the variable filter section 27 can remove fluctuation components generated by the modulation of the detection signal 6.

In operation, the detection signal 6 is inputted into the variable filter section 27. As shown in FIG. 10, the potential of the time constant control signal 24 is reduced for the leading edge of the transmitting slot. Following this, the time constant of the variable filter section 27 increases. Namely, the rise time of the transmitting burst can reliably be shortened during the three-symbol ramp period. During the data periods, fluctuations of the envelope generated by the modulation of the data section will be removed.

In such an arrangement, the scale of the circuit can be reduced. The circuit thus provided will produce no spike to improve the safety, unlike the system of selecting one from a plurality of low-pass filters.

Although the fourth embodiment has been described as to the variable filter section 27 comprising the variable resistor 28 and a capacitor, the present invention is not limited to such an arrangement. For example, a variable capacitor may be controlled in capacity by a control signal. Any other arrangement may similarly be used if it can vary the time constant by the use of a control signal.

Figure 11:
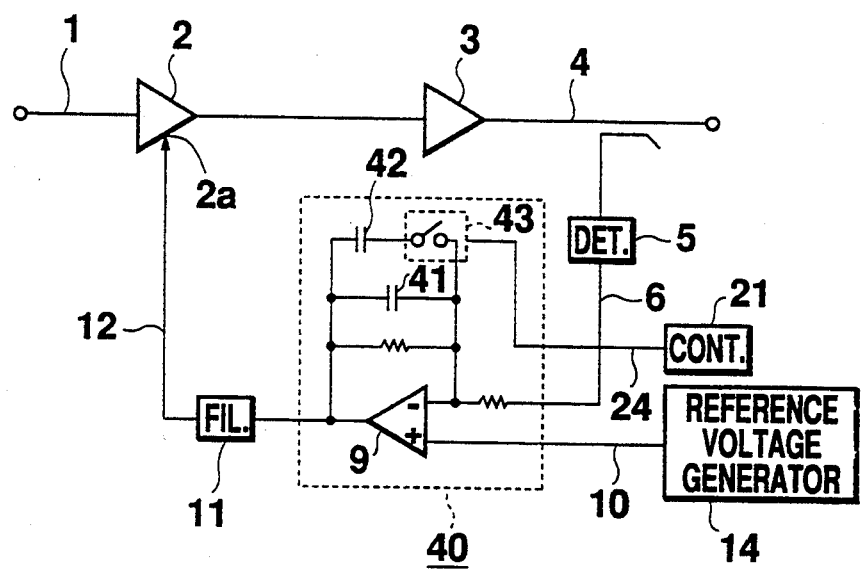
FIG. 11 is a block diagram of a fifth embodiment of an APC circuit constructed in accordance with the present invention.

FIG. 11 shows the fifth embodiment of the present invention. The fifth embodiment is different from the first embodiment in that the low-pass filter for removing the fluctuation components of the envelope generated by the modulation is of the same structure as that of the comparator 9 for generating the feedback control signal.

A loop filter 40 comprises a capacitor 41 having a smaller time constant and another capacitor 42 having a larger time constant, which capacitors are connected in parallel to each other and also in parallel to the comparator 9. The capacitor 42 is connected in series with a switching element 43 for connecting/disconnecting the capacitor 42 to the loop filter.

The detection signal 6 of the RF output signal 4 detected by the detector 5 is inputted into the loop filter 40 to remove the fluctuation components of the envelope generated by the modulation. The switching element 43, which is one element in the loop filter 40, is turned on or off by the switching control signal 24 from the control unit 21.

In the fifth embodiment, the switching element 43 is maintained turned off in the rise time of a transmitting slot (transmitting burst) or during the three-symbol ramp period. This reduces the time constant in the loop filter to secure the sharp leading edge of the transmitting burst. On termination of the ramp period, the switching element is turned on by the switching control signal 24 to increase the time constant of the loop filter. Thus, the fluctuation components in the envelope generated by the modulation in the data periods can be removed by the loop filter 40.

After influence of noise to the output signal of the loop filter has been eliminated by the low-pass filter 11, that output signal is fed back to the gain regulating terminal 2a of the variable gain amplifier 2 as a feedback control signal 12. The gain of the variable gain amplifier 2 is regulated depending on the feedback control signal inputted into the gain regulating terminal 2a thereof. This controls the transmitting power of the RF output signal.

The low-pass filter 11 may be omitted if the feedback control signal outputted from the loop filter 40 contains sufficiently low noise.

Figure 12:
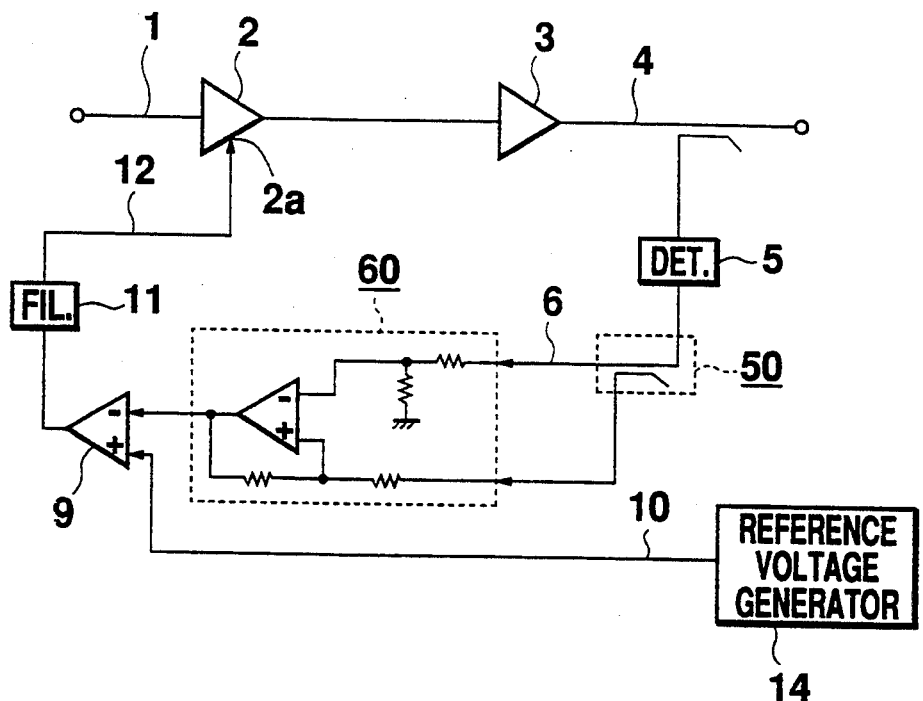
FIG. 12 is a block diagram of a sixth embodiment of an APC circuit constructed in accordance with the present invention.

FIG. 12 shows the sixth embodiment of the present invention. The sixth embodiment is different from the previous embodiments in that the sixth embodiment removes the fluctuation components of the envelope generated by the modulation without the use of any low-pass filter.

In FIG. 12, the detection signal 6 detected by the detector 5 is inputted into a subtraction circuit 60 at one terminal after passing through a coupler 50. The coupler 50 fetches an AC component from the detection signal 6, the AC component being then inputted into the other terminal of the subtraction circuit 60. The AC components represent the fluctuation components of the envelope generated by the modulation. The subtraction circuit 60 subtracts the AC components from the detection signal 6 to provide a DC output signal having no fluctuation components generated by the modulation. The comparator 9 outputs a difference signal between this DC signal and the reference voltage 10. The difference signal is a feedback control signal which is to be inputted into the gain regulating terminal 2a of the variable gain amplifier 2.

Since no low-pass filter having a large time constant is used in the APC circuit, the sixth embodiment can remove the fluctuation components generated by the modulation of the detection signal 6 while maintaining a sharp leading edge of the transmitting slot. Therefore, the sixth embodiment does not require the switching unit and/or control unit for generating the switching signal, as in the other embodiments previously described. In other words, the sixth embodiment can be of a more simplified structure having the same advantages as those of the other embodiments previously described.

The subtraction circuit of the sixth embodiment is not limited to such a structure as shown in FIG. 12, but may be any suitable circuit if it can perform the same function.

Figure 13:
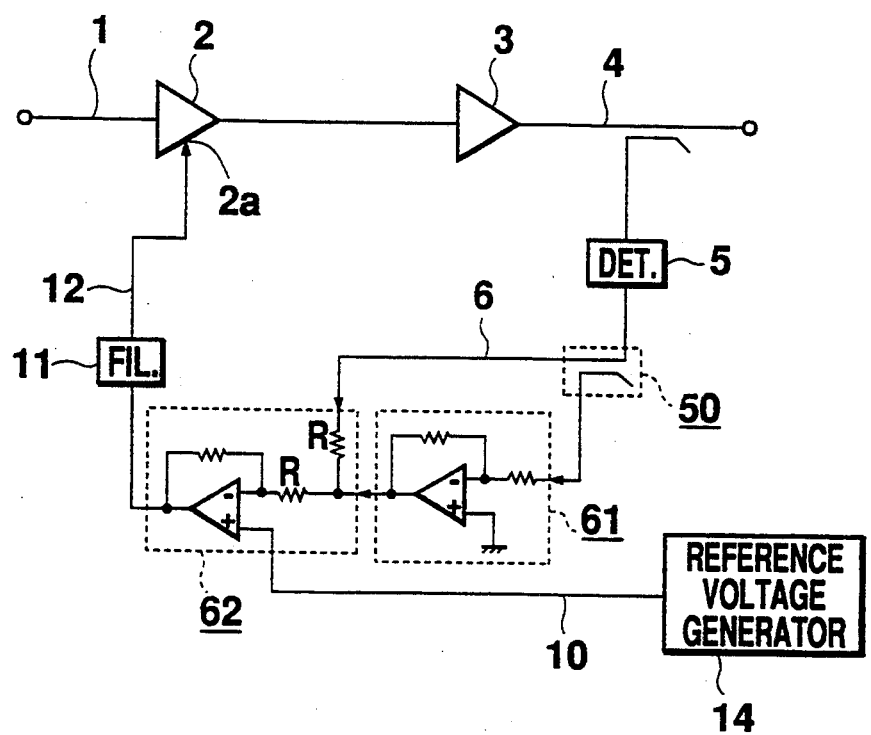
FIG. 13 is a block diagram of a seventh embodiment of an APC circuit constructed in accordance with the present invention.

FIG. 13 shows the seventh embodiment of the present invention which is a modified form of the sixth embodiment.

In the seventh embodiment, the AC component fetched by the coupler 50 are inverted by an inverting circuit 61 and then inputted into an addition circuit 62. The addition circuit 62 adds the inverted AC component from the inverting circuit 61 to the detection signal 6. As a result, there is provided a DC component in which the fluctuation components generated by the modulation have been removed from the detection signal 6. The DC component is inputted into a comparator in the addition circuit 62. The comparator outputs a difference signal between the DC component and the reference voltage 10. The difference signal is a feedback control signal to the variable gain amplifier 2.

The seventh embodiment can also provide a simplified APC circuit which does not use the switching unit and/or control unit, as in the sixth embodiment.

It is to be understood that the present invention is not only applied to the π/4 shift QPSK signal, but may also be applied to any other signal having envelope fluctuations due to the modulation.

It is also to be understood that the present invention is not only applied to the TDMA system, but may also be applied to any one of various communication systems using the burst signal. The present invention may further be applied to any other system requiring the rapid rise time of the communication without the burst signal.

I claim:

1. An automatic power control circuit for controlling the transmitting power of an RF signal having present therein envelope fluctuation components generated by modulation of said RF signal, said circuit comprising:
   a variable gain amplifier for regulating the gain of said RF input signal depending on a signal applied to a gain regulating terminal of said variable gain amplifier;
   a detector for detecting the envelope of said RF output signal corresponding to the output signal of said variable gain amplifier and for generating an envelope detection signal which includes therein said modulation generated fluctuation components;
   a fluctuation removing circuit including a low-pass filter for removing said modulation generated fluctuation components from said envelope detection signal generated by said detector; and
   a comparator for providing a difference signal between the output signal of said fluctuation removing circuit and a reference voltage obtained from a reference voltage generator to said gain regulating terminal as a feedback signal.

2. An automatic power control circuit as defined in claim 1 wherein said reference voltage generator outputs a reference voltage corresponding the transmitting power level of the RF signal.

3. An automatic power control circuit as defined in claim 1 wherein the reference voltage outputted from said reference voltage generator is constant and further comprising:
   a level switching signal generating means for generating a level switching signal corresponding to the transmitting power level of the RF signal; and
   a level switching unit connected to the output of said detector for switching the level of said envelope depending on said level switching signal.

4. An automatic power control circuit as defined in claim 1 wherein said fluctuation removing circuit comprises:
   a first low-pass filter;
   a second low-pass filter connected parallel to the first low-pass filter and having a time constant larger than the time constant of said first low-pass filter, said second low-pass filter being operable to remove the fluctuation components of said envelope generated by the modulation;
   a switching unit receiving the envelope obtained by said detector and responsive to a switching control signal to select one of said first and second low-pass filters to output said envelope; and
   a control unit for generating said switching control signal to select the first low-pass filter in the rise time of the RF signal and to select the second low-pass filter in the data periods of the RF signal.

5. An automatic power control circuit as defined in claim 4 wherein said reference voltage generator outputs a reference voltage corresponding to the transmitting power level of the RF signal.

6. An automatic power control circuit as defined in claim 4 wherein the reference voltage outputted from said reference voltage generator is constant and further comprising:
   a level switching signal generating means for generating a level switching signal corresponding to the transmitting power level of the RF signal; and
   a level switching unit connected to the output of said detector, said level switching unit being operable to select the level of said envelope depending on said level switching signal.

7. An automatic power control circuit as defined in claim 1 wherein said fluctuation removing circuit comprises:
   a low-pass filter for removing fluctuation components of said envelope generated by the modulation;
   a short-circuit line connected parallel to said low-pass filter;
   a switching unit receiving the envelope obtained by said detector and responsive to a switching control signal for selecting one of said low-pass filter and short-circuit line to output said envelope; and
   a control unit for generating said switching control signal to select said short-circuit line in the rise time of the RF signal and to select said low-pass filter in the data periods of the RF signal.

8. An automatic power control circuit as defined in claim 7 wherein said reference voltage generator outputs a reference voltage corresponding to the transmitting power level of the RF signal.

9. An automatic power control circuit as defined in claim 7 wherein the reference voltage outputted from said reference voltage generator is constant and further comprising:
   a level switching signal generating means for generating a level switching signal corresponding to the transmitting power level of the RF signal; and
   a level switching unit connected to the output of said detector, said level switching unit being operable to select the level of said envelope depending on said level switching signal.

10. An automatic power control circuit as defined in claim 1 wherein said fluctuation removing circuit comprises:

a variable filter for removing fluctuation components of said envelope generated by the modulation, the time constant of said variable filter varying depending on a time constant control signal; and a control unit for generating said time constant control signal to control the time constant of said variable filter so that it will increase in the data periods following the rise time of the RF signal rather than in the rise time of the RF signal.

11. An automatic power control circuit as defined in claim 10 wherein said reference voltage generator outputs a reference voltage corresponding to the transmitting power level of the RF signal.

12. An automatic power control circuit as defined in claim 10 wherein the reference voltage outputted from said reference voltage generator is constant and further comprising:

a level switching signal generating means for generating a level switching signal corresponding to the transmitting power level of the RF signal; and a level switching unit connected to the output of said detector, said level switching unit being operable to select the level of said envelope depending on said level switching signal.

13. An automatic power control circuit for controlling the transmitting power of an RF signal, said circuit comprising:

a variable gain amplifier for regulating the gain of an RF input signal depending on a signal applied to the gain regulating terminal of said variable gain amplifier;

a detector for detecting the envelope of an RF output signal corresponding to the output signal of said variable gain amplifier;

a loop filter receiving said envelope at one input terminal and also a reference voltage from a reference voltage generator at the other input terminal, said loop filter being operable to provide a difference signal between said envelope and said reference voltage to said gain regulating terminal as a feedback signal, said loop filter comprising a first capacitor, a second capacitor connected parallel to said first capacitor, a comparator connected parallel to said first and second capacitors and a switching unit connected in series to said second capacitor, said switching unit being responsive to a switching control signal for ON/OFF controlling said second capacitor; and a control unit for generating said switching control signal such that said second capacitor is turned off in the rise time of the RF signal and turned on in the data periods of the RF signal.

14. An automatic power control circuit as defined in claim 13 wherein said reference voltage generator outputs a reference voltage corresponding to the transmitting power level of the RF signal.

15. An automatic power control circuit as defined in claim 13 wherein the reference voltage outputted from said reference voltage generator is constant and further comprising:

a level switching signal generating means for generating a level switching signal corresponding to the transmitting power level of the RF signal; and a level switching unit connected to the output of said detector, said level switching unit being operable to select the level of said envelope depending on said level switching signal.

16. An automatic power control circuit for controlling the transmitting output of an RF signal, said circuit comprising:

a variable gain amplifier for regulating the gain of an RF input signal depending on a signal applied to the gain regulating terminal of said variable gain amplifier;

a detector for detecting an envelope of an RF output signal corresponding to the output signal of said variable gain amplifier;

a coupler for fetching an AC component from said envelope;

a subtraction circuit for subtracting the output of said coupler from said envelope which is the output of said detector; and a comparator for providing a difference signal between the output signal of said subtraction circuit and a reference voltage obtained from a reference voltage generator to said gain regulating terminal as a feedback signal.

17. An automatic power control circuit as defined in claim 16 wherein said reference voltage generator outputs a reference voltage corresponding to the transmitting power level of the RF signal.

18. An automatic power control circuit as defined in claim 16 wherein the reference voltage outputted from said reference voltage generator is constant and further comprising:

a level switching signal generating means for generating a level switching signal corresponding to the transmitting power level of the RF signal; and a level switching unit connected to the output of said detector, said level switching unit being operable to select the level of said envelope depending on said level switching signal.

19. An automatic power control circuit as defined in claim 16 wherein said subtraction circuit comprises:

an inverting circuit for inverting the output signal of said coupler; and an addition circuit for adding the output of said inverting circuit to said envelope which is the output of said detector.

20. An automatic power control circuit as defined in claim 19 wherein said reference voltage generator outputs a reference voltage corresponding to the transmitting power level of the RF signal.

21. An automatic power control circuit as defined in claim 19 wherein the reference voltage outputted from said reference voltage generator is constant and further comprising:

a level switching signal generating means for generating a level switching signal corresponding to the transmitting power level of the RF signal; and a level switching unit connected to the output of said detector, said level switching unit being operable to select the level of said envelope depending on said level switching signal.

* * * * *

UNITED STATES PATENT AND TRADEMARK OFFICE
CERTIFICATE OF CORRECTION

PATENT NO. : 5,408,197
DATED : April 18, 1995
INVENTOR(S) : Atsushi Miyake

It is certified that error appears in the above-indentified patent and that said Letters Patent is hereby corrected as shown below:

Column 3, the subheading "BRIEF DESCRIPTION THE DRAWINGS" should be —BRIEF DESCRIPTION OF THE DRAWINGS—.
Column 5, line 65, "Generating" should be —generating—.
Column 6, line 14, "Generator" should be —generator—.

Signed and Sealed this

Seventeenth Day of October, 1995

Attest:

BRUCE LEHMAN

Attesting Officer

Commissioner of Patents and Trademarks